(12) United States Patent
Sato

(10) Patent No.: US 6,445,190 B1
(45) Date of Patent: Sep. 3, 2002

(54) CONNECTOR CONTINUITY CHECKING DEVICE

(75) Inventor: Takayuki Sato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/722,401

(22) Filed: Nov. 28, 2000

(30) Foreign Application Priority Data

Dec. 3, 1999 (JP) .......................................... 11-344599

(51) Int. Cl.[7] .............................................. G01R 31/02
(52) U.S. Cl. ................................... 324/538; 324/158.1
(58) Field of Search ............................... 324/538, 539, 324/754, 158.1, 761, 555; 439/140

(56) References Cited

U.S. PATENT DOCUMENTS

| | | | | |
|---|---|---|---|---|
| 5,122,070 A | * | 6/1992 | Lebris et al. ................ | 439/140 |
| 5,231,357 A | * | 7/1993 | Moody et al. ............... | 324/539 |
| 5,455,515 A | * | 10/1995 | Saijo et al. .................. | 324/538 |
| 5,512,833 A | | 4/1996 | Fukuda et al. .............. | 324/538 |
| 5,744,966 A | * | 4/1998 | Sato ............................ | 324/538 |
| 5,831,438 A | | 11/1998 | Okura ......................... | 324/538 |
| 5,877,622 A | * | 3/1999 | Aoyama et al. ......... | 324/158.1 |
| 6,081,124 A | | 6/2000 | Chiyoda ..................... | 324/538 |
| 6,157,197 A | * | 12/2000 | Iwasaki ....................... | 324/538 |
| 6,305,969 B1 | * | 10/2001 | Sato ....................... | 324/538 X |
| 6,316,951 B1 | * | 11/2001 | Chiyoda ..................... | 324/754 |

FOREIGN PATENT DOCUMENTS

| | | |
|---|---|---|
| JP | 7-73949 | 3/1995 |
| JP | 7-113836 | 5/1995 |
| JP | 7-114963 | 5/1995 |
| JP | 7-130441 | 5/1995 |
| JP | 7-130442 | 5/1995 |
| JP | 7-254449 | 10/1995 |
| JP | 9-63701 | 3/1997 |
| JP | 9-223558 | 8/1997 |
| JP | 10-284207 | 10/1998 |
| JP | 11-31569 | 2/1999 |
| JP | 11-31570 | 2/1999 |

* cited by examiner

*Primary Examiner*—N. Le
*Assistant Examiner*—T. R. Sundaram
(74) *Attorney, Agent, or Firm*—Armstrong, Westerman & Hattori, LLP

(57) ABSTRACT

A continuity checking device for a connector which comprises a connector holding part 3, a checking part 11 including continuity checking pins 5 capable of contacting with terminals 4, and insertion checking pins 8 which can be inserted into spaces where flexible locking lances 7 of the connector are deflected, the checking part being movable back and forth with respect to the connector holding part, and links 12 which are connected to the checking part at its one end and connected to an operating lever 13 at the other end, wherein the insertion checking pins 8 are immovably fixed inside the checking part, whereby a gap 14 is created between the checking part 11 and the connector holding part 3, when the insertion checking pins are abutted against the flexible locking lances 72. Each of the links 12 includes a displacement absorbing mechanisms. Each of the links includes a pair of link plates 51, 52 and a link cover, and the displacement absorbing mechanism includes elongated holes 57, 58 respectively provided in the link plates, shafts 61 of the link cover, and an elastic member provided in the link cover for urging the link plates in an expanding direction. Biasing force of the elastic member is larger than resisting force for advancing the checking part 11.

5 Claims, 4 Drawing Sheets

CONNECTOR CONTINUITY CHECKING DEVICE

BACKGROUND OF THE INVENTION

1. Field of the Invention

The present invention relates to a continuity checking device for a connector adapted to detect an abnormal condition that terminals in a connector have been incompletely inserted, by abutting an insertion checking pin against a flexible locking lance for locking the terminals, and more particularly to the connector continuity checking device which can detect the abnormal condition by visually observing the connector continuity checking device.

2. Description of the Related Art

FIG. 4 shows an example of a conventional connector continuity checking device.

This connector continuity checking device 70 is intended to check a state of continuity of terminals with electric wires which have been inserted and locked in a connector 71. The connector continuity checking device 70 includes a connector holding part 73 fixed to a frame 72, a checking part 74 arranged movably back and forth with respect to the connector holding part 73, and an operating lever 76 for actuating the checking part 74 by way of links 75.

The connector holding part 73 has a guide part 77 of a substantially columnar shape on which the connector 71 is adapted to be set from the above. The connector 71 is thus set in the connector holding part 73. The connector 71 includes a male type connector housing 78 made of synthetic resin and female type terminals with electric wires which have been inserted and locked inside the connector housing 78.

The checking part 74 includes a guide block 79 made of insulating resin in which a connector engaging chamber 80 is formed. A plurality of electrically conductive continuity checking pins (probe pins) corresponding to the terminals in the connector 71 are provided in the connector engaging chamber 80. The continuity checking pins (not shown) are connected to electric wires (not shown) and covered with a rear cover 81 at a side where the electric wires are drawn out. The guide block 79 is slidable back and forth along a pair of guide shafts (not shown), for example, in a horizontal direction inside the frame 72.

The operating lever 76 is bent in a substantially L-shape and rotatably connected to the frame 72 around shafts 82 at lower parts of its forward end portions. Upper parts of the forward end portions of the operating lever 76 are rotatably connected to backward ends of the links 75 around shafts 83. Forward ends of the links 75 are connected to side wall faces of the guide block 79 of the checking part 74 by means of shafts (bolts) 84. The shafts 83, 84 are passed through holes in the links 75 respectively so as to be slidable with respect to inner peripheries of the holes.

By rotating the operating lever 76 in a direction of an arrow a while the connector 71 is set on the connector holding part 73, the checking part 74 moves toward the connector 71 by way of the links 75, and a front half portion of the connector 71 is inserted into the connector engaging chamber 80. At the same time, the continuity checking pins (not shown) are brought into contact with the terminals (not shown) in the connector 71 respectively.

By rotating the operating lever 76 forward, the shafts 83 perform circular motions around the lower shafts 82 whereby the links 75 move forward, and the guide block 79 connected to the other shafts 84 moves forward.

The electric wires 85 from the connector 71 are connected to a continuity checking apparatus (a circuit integrating section) by way of a connector (not shown) which is connected to the other end of the electric wires 85. The electric wires (not shown) from the continuity checking pins are also connected to the continuity checking apparatus. Thus, the terminals in the connector 71 and the continuity checking pins constitute a closed circuit. When there exists a continuity between both the members, the continuity checking apparatus indicates an OK lamp, and when there is no continuity between them, the continuity checking apparatus indicates NG by means of a buzzer or a flashing light.

Meanwhile, in Japanese Patent Laid Open Publication No. 11-31570, there has been proposed a connector continuity checking device as shown in FIG. 5 which has a function of detecting an inserted state of the terminals in the connector, in addition to the function as the connector continuity checking device as described above.

This connector continuity checking device 94 includes a plurality of insertion checking pins 96 which are integrally formed with a holder 95 made of synthetic resin so as to project therefrom, a plurality of continuity checking pins 98 which are respectively inserted and fixed in cavities 97 in the holder 95, a pin block 99 made of synthetic resin and adapted to support the holder 95 slidably in back and forth directions, probe pins 101 having slidable portions 100 which are elastically in contact with rear ends of the continuity checking pins 98, and a guide block 103 having a connector engaging chamber 102 and mated with the pin block 99. One set of pins 104 is constituted by the holder 95, the insertion checking pins 96, and the continuity checking pins 98.

A connector 105 is inserted into the connector engaging chamber 102 by means of a similar mechanism to the conventional case. On this occasion, in case where one of the terminals is not completely inserted into a terminal containing chamber 107 as represented by a terminal 106 on a lower side, a flexible locking lance 108 of the connector housing is in contact with an outer peripheral face of the terminal 106 and deflected. Accordingly, a distal end of the insertion checking pin 96 is abutted against an end of the flexible locking lance 108, and the holder 95 retreats integrally with the insertion checking pin 96 and continuity checking pin 98. In short, the set pin 104 retreats, and the abnormal condition can be detected, because a contact between the continuity checking pin 98 and the terminal 106 is not attained.

In the above described conventional structure as shown in FIG. 5, defective continuity is indicated when the terminals 106 have not been completely inserted into the connector housing. However, in such an unusual case as an indication lamp is defective or an operator has missed the indication, it is concerned that quality of the check may not be assured. There is another problem that since the holder 95 slidably retreats in the pin block 99 when the insertion checking pin 96 is abutted against the flexible locking lance 108, the holder 95 may wear due to repeated use, resulting in bad motion or jerking.

Further, in Japanese Patent laid Open Publication No. 7-73949 (not shown), there is disclosed a structure in which an insertion checking pin abutted against a flexible locking lance which has been deflected retreats and shuts off a switching part, thereby causing a faulty electrical continuity and the NG continuity is indicated. In this structure too, there has been an anxiety that the switching part may wear and must be exchanged depending frequency of operation.

In view of the above described drawbacks, it is an object of the present invention to provide a continuity checking device for a connector which has a mechanism capable of reliably checking an abnormal condition in the event of an accident such as defect of an indication lamp or overlook of the indication, in which wear around the insertion checking pins with respect to the flexible locking lances and resulting breakdown, etc. can be prevented, and further, which has a simple structure and can be manufactured at a low cost.

SUMMARY OF THE INVENTION

In order to attain the above described object, there is provided, according to the present invention, a connector continuity checking device comprising a connector holding part in which a connector is set, a checking part including continuity checking pins capable of contacting with terminals of the connector, and insertion checking pins which can be inserted into spaces where flexible locking lances of the connector are deflected, the checking part being movable back and forth with respect to the connector holding part, and links which are connected to the checking part at its one end and connected to an operating lever at the other end, wherein the insertion checking pins are immovably fixed inside the checking part, whereby a gap is created between the checking part and the connector holding part, when the insertion checking pins are abutted against the flexible locking lances.

According to a second aspect of the present invention, each of the links includes a displacement absorbing mechanism.

According to a third aspect of the present invention, each of the links includes a pair of link plates and a link cover, and the displacement absorbing mechanism includes elongated holes respectively provided in the link plates in a longitudinal direction, and shafts of the link cover adapted to be slidably engaged in the elongated holes.

According to a fourth aspect of the present invention, the displacement absorbing mechanism includes an elastic member provided in the link cover, the link plates being urged in an expanding direction by the elastic member.

According to a fifth aspect of the present invention, biasing force of the elastic member is larger than resisting force for advancing the checking part.

DESCRIPTION OF THE PREFERRED EMBODIMENTS

Figure 1:
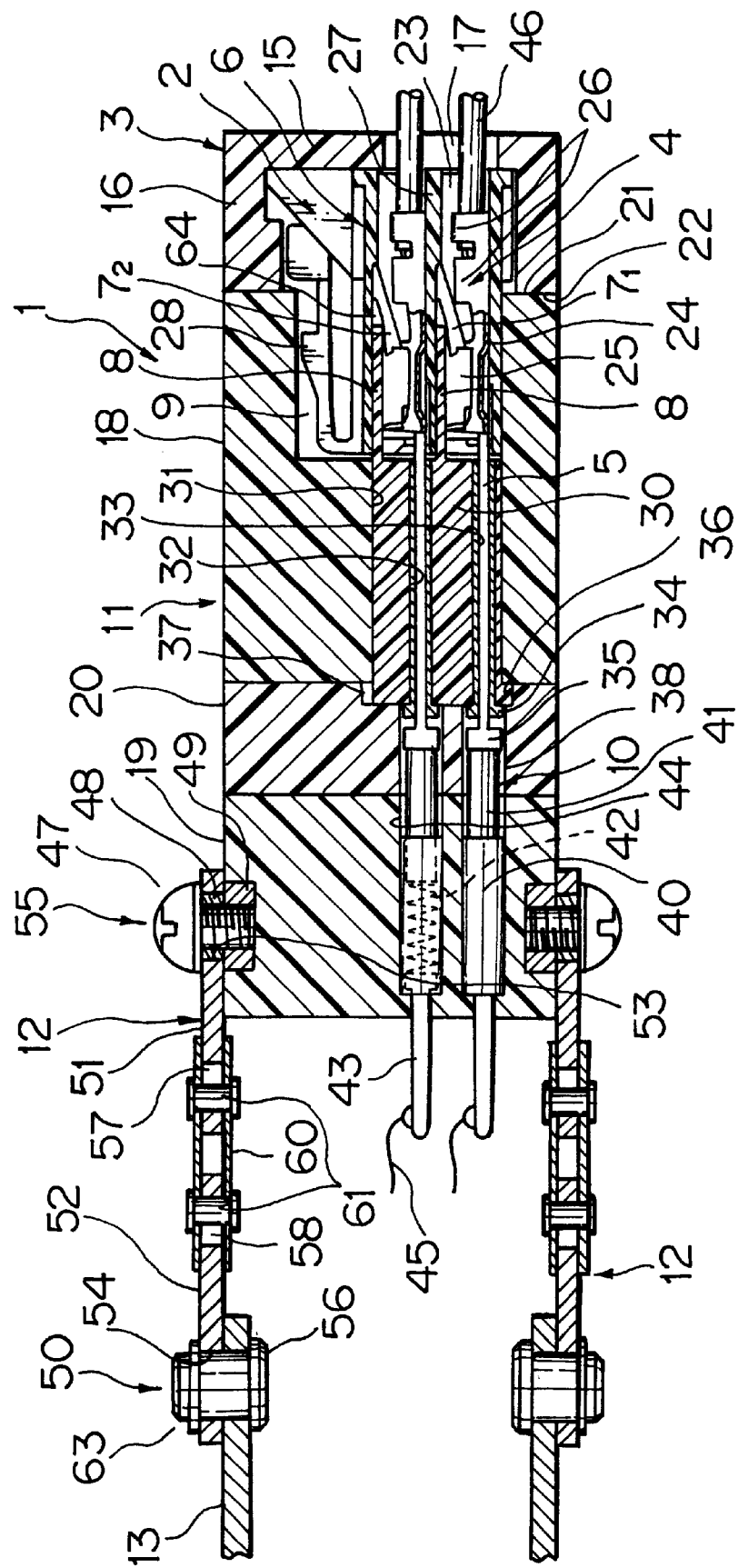
FIG. 1 is a cross sectional view of a continuity checking device for a connector according to one embodiment of the present invention, showing a completely inserted state of terminals (a state where flexible locking lances have locked the terminals)

Now, the present invention will be described in detail by way of examples referring to the drawings.

Figure 2:
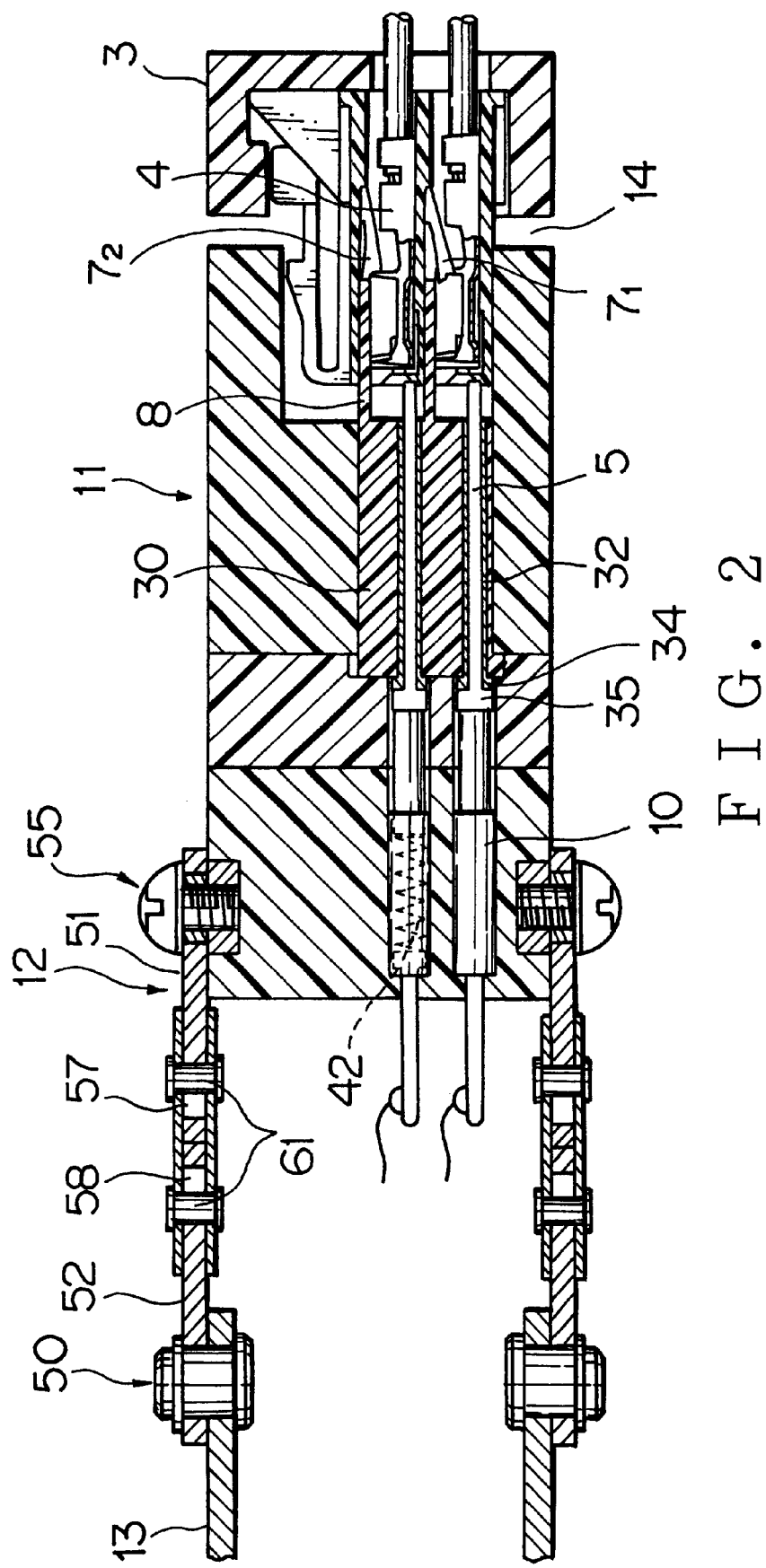
FIG. 2 is a cross sectional view of the connector continuity checking device in a state where the terminals are not locked by the flexible locking lances.
Figure 4:
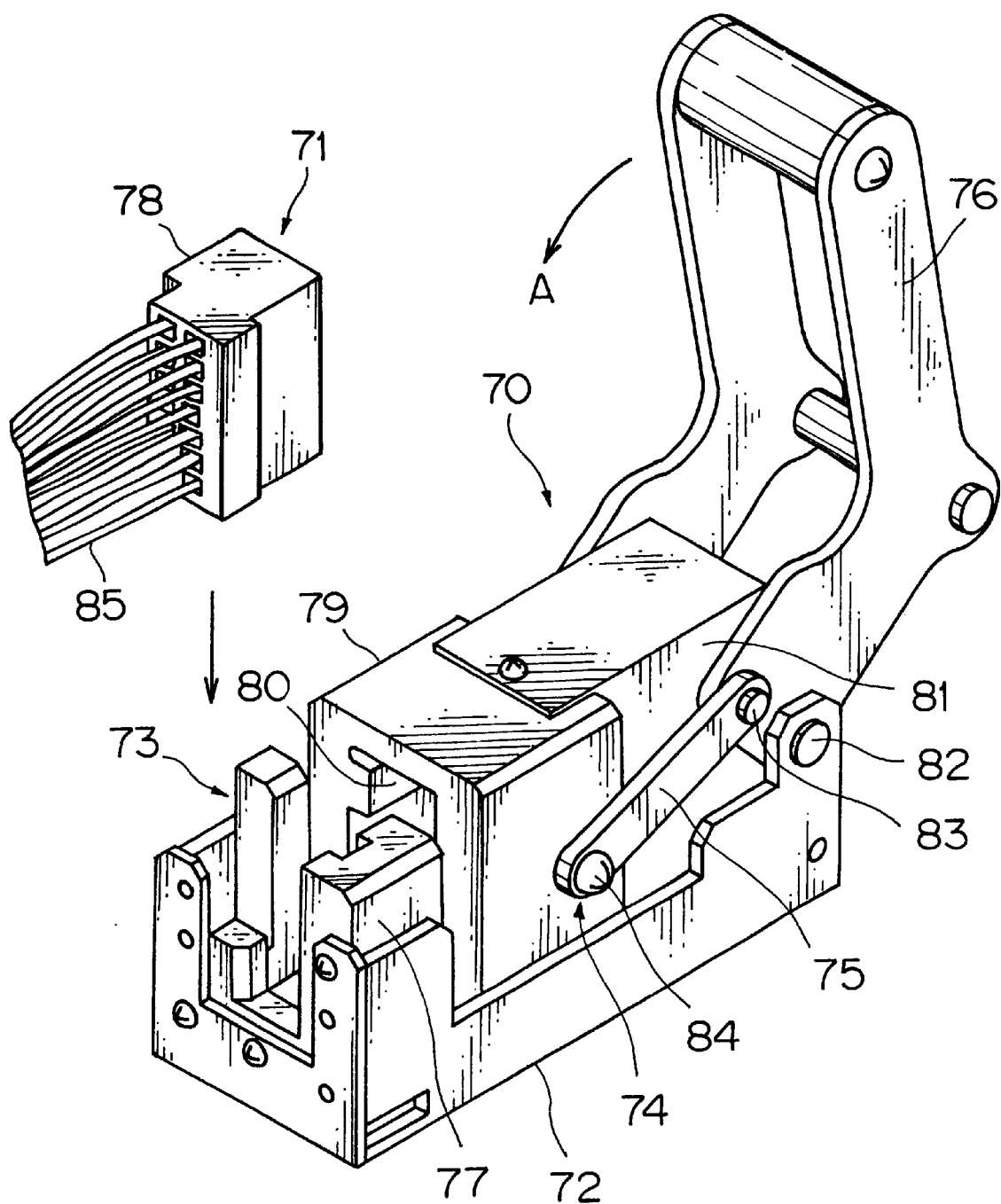
FIG. 4 is an exploded perspective view showing an example of a conventional connector continuity checking device.

FIGS. 1 and 2 show one embodiment of a continuity checking device for a connector according to the present invention. FIG. 1 shows a case where the terminals have been completely inserted, while FIG. 2 shows a case where the terminals have been incompletely inserted, or return of the flexible locking lances is defective. Because the sliding mechanism in the checking part and structure of the operating lever and so on are similar to those in the conventional case (FIG. 4), they are omitted in FIGS. 1 and 2.

As shown in FIG. 1, the connector continuity checking device 1 comprises a connector holding part 3 made of synthetic resin in which a connector 2 in set, a checking part 11 including continuity checking pins 5 facing with terminals 4 of the connector 2 at their forward ends, and insertion checking pins 8 facing with flexible locking lances 7 (71, 72) in a connector housing 6 which are projected into a connector engaging chamber 9, and an operating lever 13 adapted to advance the checking part 11 toward the connector holding part 3 by means of a pair of metal links 12. Rearward ends of the continuity checking pins 5 are elastically in contact with probe pins (conductive pins) 10. The insertion checking pins 8 are immovably fixed inside the checking part 11, and the links 12 are respectively provided with displacement absorbing mechanisms. When the insertion checking pin 8 is abutted against the flexible locking lance 72 in a deflected state, the checking part 11 retreats as compared with FIG. 1, thereby to create a gap 14 between the connector holding part 3 and the checking part 11.

In FIG. 1, the connector holding part 3 has a front wall 15 provided with a cut-out 17 for guiding electric wires to the exterior, and two side walls 16. Since an upper part of the connector holding part 3 is open, a backward half of the connector 2 can be inserted into the connector holding part 3 from the above. A rearward end of the connector 2 is in contact with an inner face of the front wall 15, and fixed by means of guide grooves or the like formed in the side walls 16 so as not to move back and forth as well as to the left and right.

The checking part 11 consists of a guide block 18 formed of synthetic resin and having the connector engaging chamber 9, the insertion checking pins 8 fixed inside the guide block 18, the continuity checking pins 5 passing through the guide block 18 so as to be movable back and forth, a pin block 19 formed of synthetic resin and fixing the probe pins 10, and an intermediate block 20 formed of synthetic resin and retained between the blocks 18 and 19. In the intermediate block 20, rearward ends of the continuity checking pins 5 and forward ends of the probe pins 10 are abutted against each other.

A forward end face 21 of the guide block 18 is in tight contact with a rearward end face 22 of the connector holding part 3, in a state where a forward half of the connector 2 is inserted into the connector engaging chamber 9 in the guide block 18, and the terminals 4 have been completely inserted and locked by the locking lances 7.

The connector 2 has the female type terminals 4 equipped with the electric wires and inserted into terminal containing chambers 23 in the male type connector housing 6. Each of the terminals 4 includes a pair of elastic contact pieces 25 substantially in a shape of an eyeglass in cross section at one side of a base plate 24, and an electric wire fitting portion 26 at the other side of the base plate 24. Rearward ends of the elastic contact pieces 25 are locked by a stepped portion formed at an end of the flexible locking lance 7. A distal end of the continuity checking pin 5 is in contact with a distal end of the base plate 24.

The flexible locking lance 7 projects diagonally forward from an upper (when the lock arm 28 is located at an upper side) wall 27 of the terminal containing chamber 23. The connector 2 has a plurality of the terminal containing chambers 23 in two vertical sections, and the terminals 4 are respectively inserted and locked in the terminal containing chambers 23.

The insertion checking pins 8 corresponding to the number of the flexible locking lances 7 are integrally formed so as to project from a holder 30 in a shape of a rectangular block. The holder 30 is retained in a cavity 31 in the guide block 18 by fixing means such as press fitting or screw fitting, etc. The insertion checking pins 8 are fixed to the guide block 18 integrally with the holder 30. In this embodiment, both the holder 30 and the insertion checking pins 8 are made of metallic material.

The holder 30 is provided with longitudinal bores 32 corresponding to the distal ends (contact points) of the base plates 24 of the terminals 4. The continuity checking pins 5 made of conductive metal are passed through the bores 32, and sleeves 33 made of insulating resin are inserted and fixed between outer faces of the continuity checking pins 5 and inner faces of the bores 32. Forward ends of the sleeves 33 are coplanar with a forward end of the holder 30, and rearward ends of the sleeves 33 project from a rearward end of the holder 30 to form flange portions 34 having a larger diameter.

Each of the continuity checking pins 5 is rectilinearly formed and longer than a total length of the holder 30 with its forward and rearward ends projected from the holder 30. The continuity checking pin 5 has a large diametered portion 35 at the rearward end, and the flange portion 34 of the sleeve 33 is located between the large diametered portion 35 and the rearward end of the holder 30 to insulate the continuity checking pin 5 from the holder 30. The continuity checking pin 5 is movable back and forth along the sleeve 33. It is to be noted that the holder 30 and the insertion checking pins 8 can be integrally formed of insulating resin material. In such case, the sleeve 33 is not required.

The holder 30 is provided at its backward end with an integral flange portion 36 as a stopper, which is pressed and retained by an inner face of a recess 37 in the intermediate block 20. The intermediate block 20 has a rather small thickness and is further provided with holes 38 continuing from the recess 37. The large diametered portion 35 at the rearward end of the continuity checking pin 5 is engaged in each of the holes 38 slidably in back and forth direction. A forward end of the probe pin 10 is in elastic contact with the diametered portion 35 in the hole 38.

The probe pin 10 consists of a large diametered tubular portion 40, a small diametered pin body 41 which is slidably engaged in the tubular portion 40, a coil spring 42 which urges the pin body 41 in the tubular portion 40 in a protruding direction, and a lead terminal 43 continuing from the tubular portion 40. The tubular portion 40 is inserted and fixed in a bore 44 formed in the pin block 19. The pin body 41 is retractable against a force of the coil spring 42 by being pushed by the continuity checking pin 5. To the lead terminal 43, is connected an electric wire 45 which constitutes an exterior circuit, and the electric wire 45 is connected to a continuity checking apparatus (not shown) including a display unit together with an electric wire 46 from the connector 2.

Figure 3:
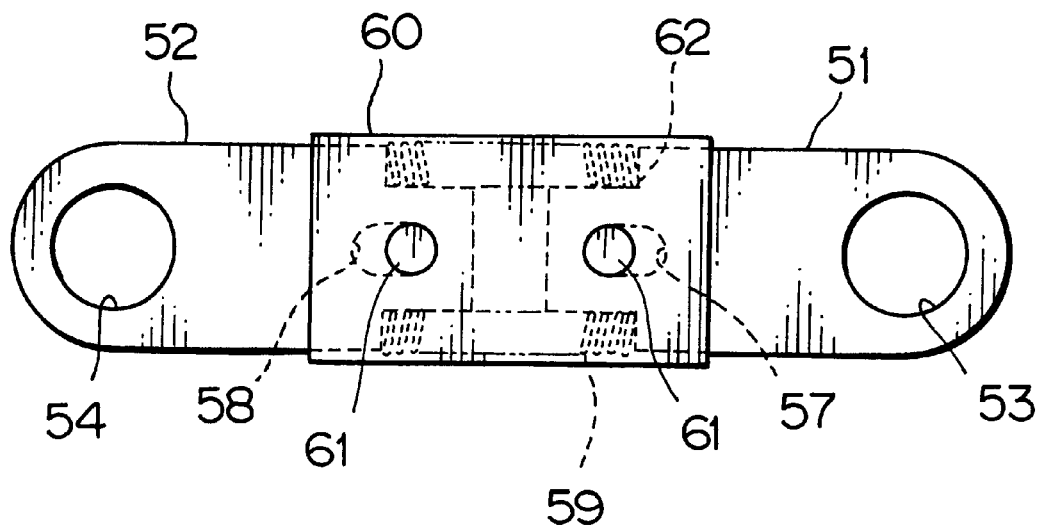
FIG. 3 is a side view showing a link provided with a displacement absorbing mechanism.
Figure 5:
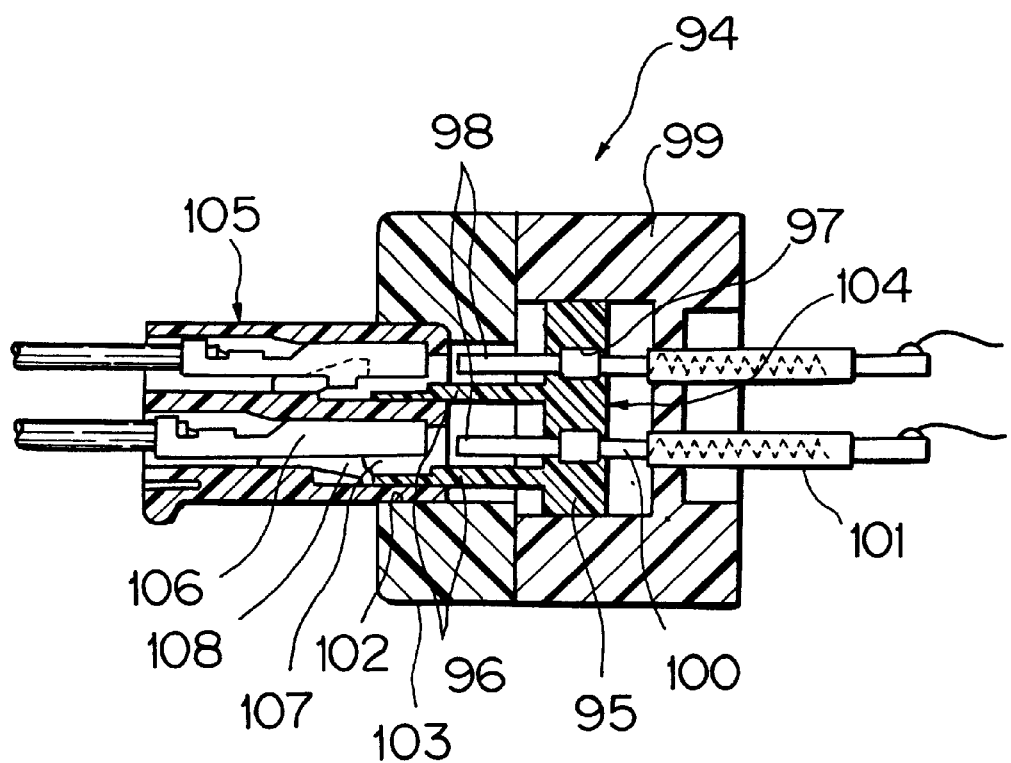
FIG. 5 is a sectional view showing another example of the conventional connector continuity checking device.

Forward ends of the links 12 are fastened to both side walls of the pin block 19 by means of bolts 47, sleeves 48 and nuts 49, while rearward ends of the links 12 are fastened to the operating lever 13 by means of a shaft 50. A pair of the left and right links 12 are provided with displacement absorbing mechanisms respectively. Specifically, as shown in FIG. 3 too, each of the links 12 consists of a pair of link plates 51, 52 having the same length and a substantially rectangular shape, a link cover 60 which couples the link plates 51, 52 slidably in a longitudinal direction, and a helical compression spring (elastic member) 59 which urges the link plates in an expanding direction. Elongated holes 57, 58 of the link plates 51, 52, a pair of shafts 61, and the helical compression springs 59 cooperate to constitute a displacement absorbing mechanism. The link plates 51, 52 are separated in a longitudinal direction. A round hole 53 at a forward end of the link plate 51 engages around an outer periphery of the sleeve 48 with substantially no clearance, and a round hole 54 at a rearward end of the link plate 52 engages around an outer periphery of the shaft 50 on the operating lever 13 with substantially no clearance. The bolt 47 and the sleeve 48 constitute the shaft 55 on the pin block 19. The shaft 50 on the operating lever has a flange portion 56 at one end and is covered with a retaining ring 63 which is engaged in a circumferential groove formed at the other end.

The forward link plate 51 and the rearward link plate 52 are respectively formed with the elongated holes 57, 58 at their end portions facing with each other. Shafts 61 in a form of short column are slidably inserted in the elongated holes respectively, and pass through round holes in the link cover 60 to be fixed at flange portions without extraction. In a state as shown in FIG. 1, the link 12 is expanded so that the forward shaft 61 is aligned at a rearward end of the elongated hole 57, and the rearward shaft 61 is aligned at a forward end of the elongated hole 58.

As shown in FIG. 3, both the link plates 51, 52 are elastically urged by the helical springs 59 in a longitudinally expanding direction. Specifically, the link plates 51, 52 are respectively formed with cut-outs 62 at both upper and lower sides of their end portions facing with each other. In the cut-outs 62, are fitted both end portions of the helical springs 59 so as to expand and contract. Both the end portions of the helical springs 59 are elastically abutted against end faces of the cut-outs 62. The upper and lower helical springs 59 are arranged in parallel inside the link cover 60 which is formed in a shape of rectangular tube. A pair of forward and rearward round holes are formed in both side walls of the link cover 60, and the shafts 61 are inserted in the round holes with no substantial clearance and fixed to both the side walls by fixing means such as flange portions, caulking, locking rings, etc.

Total force of the two pairs of the upper and lower, and left and right helical springs 59 is set larger than total force of sliding resistance of the checking part 11 with respect to a frame (not shown), sliding resistance of the connector 2 when it is inserted into the connector engaging chamber 9 in the checking part 11, sliding resistance of the continuity checking pin 5, and biasing force of the coil spring 42 of the probe pin 10, that is, resisting force when the checking part 11 moves forward.

It is to be noted that a single link 12 (a pair of the link plates 51, 52) instead of a pair of the left and right links 12 can be disposed at a center of the pin block 19. In this case too, value of the biasing force of the helical springs 59 must be the same as described above. Further, in place of the helical springs 59, other elastic biasing means (elastic member) which are not shown can be employed.

Moreover, a pair of link plates (not shown) which are longer than the aforesaid link plates 51, 52 may be overlapped, and a forward end of one link plate and a rearward end of the other link plate may be formed with elongated holes which slidably engage with the shafts 50, 55 respectively. A pair of the link plates may be connected by means of a helical compression spring and elastically biased in an expanding direction. The elongated holes in the link plates and the helical compression spring constitute a displacement absorbing mechanism.

The operating lever 13 is rotated forward in the same manner as in the conventional case (FIG. 4) in a state where the terminals 4 have been completely inserted in the connector 2 and locked by the flexible locking lances 7, as shown in FIG. 1, to engage the checking part 11 with the connector 2 by way of the links 12. On this occasion, both the link plates 51, 52 are brought in a most expanded state under the biasing force of the helical springs 59 (FIG. 3) with no longitudinal displacement. In other words, the links 12 are expanded long when viewed from the side.

The distal end of the insertion checking pin 8 in the checking part 11 enters in a space 64 in which the flexible locking lance 7 is deflected, while the distal end of the continuity checking pin 5 is in contact with the distal end of the terminal 4. The rearward end of the continuity checking pin 5 is in contact with the forward end of the probe pin 10. This enables the electric wire 46 of the terminal side and the electric wire 45 of the probe pin side to form a closed circuit via the continuity checking apparatus (not shown) and indicates that the continuity check is OK.

In the event that the terminal 4 h as been incompletely inserted as represented by the flexible locking lance 72 in FIG. 2, or the flexible locking lance 72 itself is deformed or caught and remains deflected without returning, when the operating lever 13 is rotated forward to move the checking part 11 toward the connector holding part 3, the distal end of the insertion checking pin 8 is abutted against the distal end of the deflected flexible locking lane 72. Therefore, a further forward movement of the checking part 11 is hindered, and a large gap 14 is created between the connector holding part 3 and the checking part 11. A width of the gap 14 is as large as a portion of the distal end of the insertion checking pin 8 which has been inserted into the deflection space 64 of the flexible locking lance 7 in FIG. 1.

It will be easily and reliably detected that the return of the flexible locking lance 7 is incomplete, by visually confirming the gap 14. Of course, a result of the continuity check will be NG, since the distal end of the continuity checking pin 5 is not in contact with the distal end of the terminal 4. Thus, the abnormal condition will be detected by the double means. The large diametered portion 35 at the rearward end of the continuity checking pin 5 is urged by the coil spring 42 of the probe pin 10 and kept in contact with the flange portion 34 of the insulating sleeve 33 at the rearward end of the holder 30. Since the insertion checking pin 8 will never slide in the checking part 11, abrasion occurs only with sliding contact with the connector 2. Accordingly, there occurs extremely little wear, and there will be no anxiety of faults such as incomplete return of the flexible locking lance as it gets entangled.

In addition, when the distal end of the insertion checking pin 8 is abutted against the distal end of the flexible locking lance 72, the links 12 are contracted against the force of the helical springs 59, so that the elongated hole 57 of the forward link plate 51 slidably retreats along the forward shaft 61 of the link cover 60 and, at the same time, the elongated hole 58 of the rearward link plate 52 slidably advances along the rearward shaft 61. In this manner, the distance between the shafts 50, 55 is reduced, and the helical springs 59 are compressed (FIG. 3). The biasing force of the helical springs 59 damp a shock of the links when they are contracted, enables the expanding motion of the links to be smoothly performed, and prevents defective sliding motions between the link plates and between the link plates 51, 52 and the shafts 61.

When the operator see the link 12 from the side, in the contracted state as shown in FIG. 2, the total length of the link has become shorter than the expanded state as shown in FIG. 1. This also enables the operator to detect the abnormal condition.

The above described link 12 can be applied to all other types of connector continuity checking devices, and can be easily exchanged by simply loosening the bolt 47 and pulling out the retaining ring 63 of the shaft 50. Other types of connector continuity checking devices having the insertion checking pins 8 can be easily modified provided that the insertion checking pins 8 are changed into a fixed type.

Although the present invention has been fully described by way of examples referring to the accompanying drawings, it is to be noted that various changes and modifications will be apparent to those skilled in the art.

What is claimed is:

1. A connector continuity checking device comprising;
   a connector holding part in which a connector is set;
   a checking part including continuity checking pins capable of contacting with terminals of said connector, and insertion checking pins which can be inserted into spaces where flexible locking lances of said connector are deflected, said checking part being movable back and forth with respect to said connector holding part; and
   links which are connected to said checking part at its one end and connected to an operating lever at the other end,
   wherein said insertion checking pins are immovably fixed inside said checking part, whereby, upon movement of the checking part towards the connector holding part and insertion of a terminal, upon incomplete insertion of a terminal, a distal end of an insertion checking pin is abutted against a distal end of a flexible locking lance, and a visible gap is created between a forward end face of said checking part and a rearward end face of said connector holding part, when said insertion checking pins are abutted against said flexible locking lances.

2. The connector continuity checking device as claimed in claim 1, wherein each of said links includes a displacement absorbing mechanism.

3. The connector continuity checking device as claimed in claim 2, wherein each of said links includes a pair of link plates and a link cover, and said displacement absorbing mechanism includes elongated holes respectively provided in said link plates in a longitudinal direction, and shafts of said link cover adapted to be slidably engaged in said elongated holes.

4. The connector continuity checking device as claimed in claim 3, wherein said displacement absorbing mechanism includes an elastic member provided in said link cover, said link plates being urged in an expanding direction by said elastic member.

5. The connector continuity checking device as claimed in claim 4, wherein biasing force of said elastic member is larger than resisting force for advancing said checking part.

* * * * *